(12) United States Patent
Haddad et al.

(10) Patent No.: US 6,172,909 B1
(45) Date of Patent: *Jan. 9, 2001

(54) RAMPED GATE TECHNIQUE FOR SOFT PROGRAMMING TO TIGHTEN THE $V_T$ DISTRIBUTION

(75) Inventors: Sameer S. Haddad, San Jose; Janet S. Wang, San Francisco, both of CA (US)

(73) Assignee: Advanced Micro Devices, Inc., Sunnyvale, CA (US)

( * ) Notice: Under 35 U.S.C. 154(b), the term of this patent shall be extended for 0 days.

This patent is subject to a terminal disclaimer.

(21) Appl. No.: 09/370,380

(22) Filed: Aug. 9, 1999

(51) Int. Cl.[7] .................................................. G11C 16/04
(52) U.S. Cl. ................................ 365/185.19; 365/185.29; 365/185.33
(58) Field of Search ........................ 365/185.19, 185.29, 365/185.33, 185.11, 185.12, 185.26

(56) References Cited

U.S. PATENT DOCUMENTS 5,270,980 * 12/1993 Pathak et al. .................... 365/185.29
5,901,090 * 5/1999 Haddad et al. ................... 365/185.29

OTHER PUBLICATIONS

Secondary Electron Flash–a High Performance Low Power Flash Technology for 0.35 um and Below, by J.D. Bude, M. Mastrapasqua, M.R. Pinto, R.W. Gregor, P.J. Kelley, R.A. Kohler, C.W. Leung, Y. Ma, R.J. McPartland, P.K. Roy, R. Singh, Bell Laboratories, Lucent Technologies. 1997 IEEE, 11.3.1–11.3.4.

Flexible Hot–Electron Programming of Flash Memories, David Esseni and Bruno Ricco, DEIS, Univ. of Bologna, Viale Risorgimento 2, 40136 Bologna, Italy. (No Date and No Page Number).

* cited by examiner

*Primary Examiner*—David Nelms
*Assistant Examiner*—David Lam
(74) *Attorney, Agent, or Firm*—H. Donald Nelson

(57) ABSTRACT

A method to tighten the threshold voltage distribution curve in a memory device composed of multiple memory cells organized in rows and columns by soft programming each memory cell. Soft programming voltages that utilize the hot-carrier mechanism are selected and are applied sequentially to memory cells in wordlines. The soft programming voltages include a ramped voltage $V_{GS}$ of <3 volts, a $V_{DS}$ of <5 volts and a $V_{sub}$ of <0 volts. The soft programming voltages are applied for a time period of <10 microseconds. The $V_T$ distribution is reduced to a maximum width of <2 volts. The soft programming is applied to the memory cells after the memory cells have been verified as having been erased and a having been overerase corrected.

11 Claims, 8 Drawing Sheets

RAMPED GATE TECHNIQUE FOR SOFT PROGRAMMING TO TIGHTEN THE $V_T$ DISTRIBUTION

BACKGROUND OF THE INVENTION

1. Field of the Invention

This invention relates generally to the art of microelectronic integrated circuits. More specifically, this invention relates to the art of erasing microelectronic flash Electrically Erasable Programmable Read-Only Memory (EEPROM) devices. Even more specifically, this invention relates to a method of erasing a microelectronic flash Electrically Erasable Programmable Read-Only Memory device that tightens the $V_T$ distribution.

2. Discussion of the Related Art

One type of programmable memory cell is commonly referred to as a flash memory cell. The structure of one type of flash memory cell includes a source and a drain formed in a silicon substrate. The structure of another type of flash memory cell includes a source and a drain formed in a well that is formed in a silicon substrate. The flash memory cell includes a stacked gate structure formed on the silicon substrate. The region of the silicon substrate beneath the stacked gate structure is known as the channel region of the flash memory cell.

The stacked gate structure of a flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer.

Programming operations on a flash memory cell involve the application of a relatively large constant voltage to the drain of the flash memory cell while an even larger voltage is applied to the control gate. During such a programming operation, the source of the flash memory cell is maintained at a ground level or a zero voltage level in relation to the voltages applied to the control gate and drain.

Such a relatively high voltage potential applied between the drain and source causes electrons to flow through the channel region from the source to the drain. The electrons flowing between the source and drain can attain relatively high kinetic energy levels near the drain. In addition, the high constant voltage applied to the control gate raises the voltage potential of the floating gate to a high level at the start of the programming operation. Such a high voltage potential on the floating gate usually attracts the electrons flowing through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of a flash memory cell to cause conduction through the channel region during a read operation on the flash memory cell. The time involved in a programming operation depends upon the rate at which electrons are injected onto the floating gate. As can be appreciated, the slower the rate of injection the longer the programming time to reach the desired threshold voltage.

With such programming techniques, the relatively high voltage potential of the floating gate at the start of the programming operation is reduced as electrons accumulate on the floating gate. Such a reduction in the voltage potential of the floating gate causes a corresponding reduction in the rate of electron injection onto the floating gate. Such a reduction in the rate of electron injection increases the time required to program a flash memory cell to the desired threshold voltage. Such increased programming time slows the overall speed of flash memory devices that employ such programming techniques.

In addition, it is well known that a hot carrier programming technique results in the formation of electron-hole pairs in the channel region of the flash memory cell near the drain. The electron-hole pairs are formed when high-energy electrons bombard the crystal lattice structure of the silicon substrate and dislodge other electrons from the lattice. Moreover, the portions of the channel region near the drain usually have a relatively high voltage potential due to the high voltage applied to the drain. As a consequence, the voltage potential of the floating gate can fall below the voltage potential of the portion of the channel region located near the drain as the voltage level on the floating gate decreases during programming. Under this condition, holes from the electron-hole pairs that are created in the channel region near the drain can migrate throughout the tunnel oxide layer and onto the floating gate. Such migration of holes onto the floating gate causes surface damage to the tunnel oxide layer. Such surface damage usually causes long-term reliability problems in the flash memory cell by reducing the rate of injection of electrons onto the floating gate during programming. In addition, such surface damage can interfere with current flow through the channel region of the flash memory cell during a read operation that also results in a reduction in long-term reliability.

The microelectronic flash or block-erase Electrically Erasable Programmable Read-Only Memory (Flash EEPROM) includes an array of cells that can be independently programmed and read. The size of each cell and thereby the memory are made small by omitting transistors known as select transistors that would enable the cells to be erased independently. As a result, all of the cells must be erased together as a block.

A flash memory device of this type includes individual Metal-Oxide-Semiconductor (MOS) field effect transistor (FET) memory cells. Each of the FETs includes a source, a drain, a floating gate and a control gate to which various voltages are applied to program the cell with a binary 1 or 0, to read the cells, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying programming voltages as follows: a voltage, typically in the range of 9–10 volts to the control gate, a voltage of approximately 5 volts to the drain and grounding the source. As discussed above, these voltages cause hot electrons to be injected from a drain depletion region into the floating gate. Upon removal of the programming voltages, the injected electrons are trapped in the floating gate and create a negative change therein that increases the threshold voltage of the cell to a value in excess of approximately 4 volts.

A cell is read by applying a voltage of about 5 volts to the control gate, applying about 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of minus 10 volts to the control gate, applying 5 volts to the source and allowing the drain to float can also erase a cell. Another method of erasing a cell is by applying 5 volts to the P-well and minus 10 volts to the control gate while allowing the source and drain to float.

A problem with conventional flash EEPROM cells is that because of manufacturing tolerances, some cells become over-erased before other cells become sufficiently erased. The floating gates of the over-erased cells are either completely or partially depleted of electrons and have a very low negative charge or become positively charged. The over-erased cells can function as depletion mode transistors that cannot be turned off by normal operating voltages applied to their control gates and introduce leakage current to the bit line during subsequent program and read operations. The slightly overerased cells can introduce varying amounts of leakage current to the bitline depending upon the extent of overerasure.

More specifically, during program and read operations only one wordline is held high at a time, while the other wordlines are grounded. However, because a positive voltage is applied to the drains of all of the cells and if the threshold voltage of an unselected cell is very low, zero or negative, a leakage current will flow through the source, channel and drain of the cell.

Figure 4:
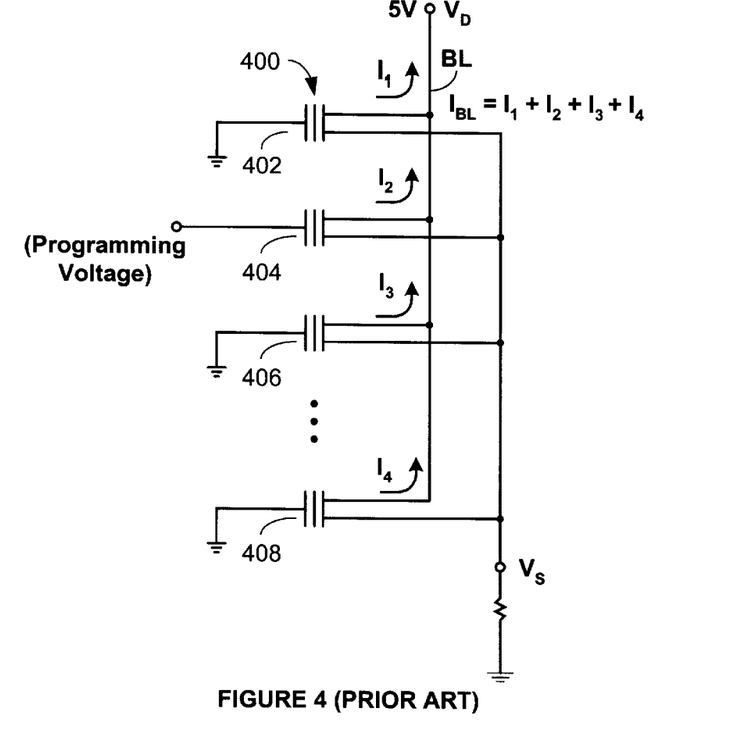
FIG. 4 is a simplified electrical schematic diagram of a column of flash EEPROM cells illustrating the leakage currents from overerased or low threshold voltage memory cells.

The undesirable effect of leakage current is illustrated in FIG. 4, which is a simplified electrical schematic diagram of a column 400 of flash EEPROM cells 402, 404, 406, and 408. The sources of the column 400 of transistors are all connected to a source supply voltage $V_S$. A programming voltage $V_{CG}$ is applied to the control gate of the transistor 404, which turns it on. A current $I_2$ flows through the transistor 404 from ground through its source, channel (not shown) and drain. Ideally, the bitline current $I_{BL}$ is equal to $I_2$. However, if one or more of the unselected transistors, for example transistors 402, 406 or 408 as illustrated in FIG. 4, are overerased or slightly overerased, their threshold voltages will be very low, zero or even negative, and background leakage currents $I_1$, $I_3$, and $I_4$ could flow through the transistors 402, 406, and 408, respectively. The bitline current $I_{BL}$ would then be equal to the sum of $I_2$ and the background leakage currents $I_1$, $I_3$ and $I_4$. In a typical flash EEPROM, the drains of a large number of memory transistor cells, for example 512 transistor cells are connected to each bitline. If a substantial number of cells on the bitline are drawing background leakage current, the total leakage current on the bitline can exceed the cell read current. This makes it impossible to read the state of any cell on the bitline and therefore renders the memory inoperative.

It is known in the art to reduce the threshold voltage distribution by performing an over-erase correction operation, which reprograms the most over-erased cells to a higher threshold voltage. An over-erase correction operation of this type is generally known as Automatic Programming Disturb (APD).

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVER-ERASE AND PREVENTS ERASE VERIFY ERRORS," issued Jun. 24, 1997 to Lee Cleveland. This patent is assigned to the same assignee as the present invention and is incorporated herein by reference in its entirety. The method includes sensing for over-erased cells and applying programming pulses thereto, which bring their threshold voltages back up to acceptable values.

Following application of an erase pulse, under-erase correction is first performed on a cell-by-cell basis by rows. The cell in the first row and column position is addressed and erase verified by applying 4 volts to the control gate (wordline), 1 volt to the drain (bitline), grounding the source, and using sense amplifiers to sense the bitline current and thereby determine if the threshold voltage of the cell is above a value of, for example, 2 volts. If the cell is under-erased, indicated by a threshold voltage above 2 volts, the bitline current will be low. In this case, an erase pulse is applied to all of the cells, and the first cell is erase verified again.

After application of each erase pulse and prior to a subsequent erase verify operation, over-erase correction is performed on all of the cells of the memory. Overerase verify is performed on the bitlines of the array in sequence. This is accomplished by grounding the wordlines, applying typically 1 volt to the first bitline, and sensing the bitline current. If the current is above a predetermined value, this indicates that at least one of the cells connected to the bitline is over-erased and is drawing leakage current. In this case, an over-erase correction pulse is applied to the bitline. This is accomplished by applying approximately 5 volts to the bitline for a predetermined length of time such as 100 $\mu$s.

After application of the over-erase correction pulse the bitline is verified again. If bitline current is still high indicating that an over-erased cell still remains connected to the bitline, another over-erase correction pulse is applied. This procedure is repeated for all of the bitlines in sequence.

The procedure is repeated, as many times as necessary until the bitline current is reduced to the predetermined value, which is lower than the read current. Then, the procedure is performed for the rest of the cells in the first row and following rows until all of the cells in the memory have been erase verified.

By performing the over-erase correction procedure after each erase pulse, the extent to which cells are over-erased is reduced, improving the endurance of cells. Further, because over-erased cells are corrected after each erase pulse, bitline leakage current is reduced during erase verify, thus preventing under-erased cells from existing upon completion of the erase verify procedure.

Figure 5A:
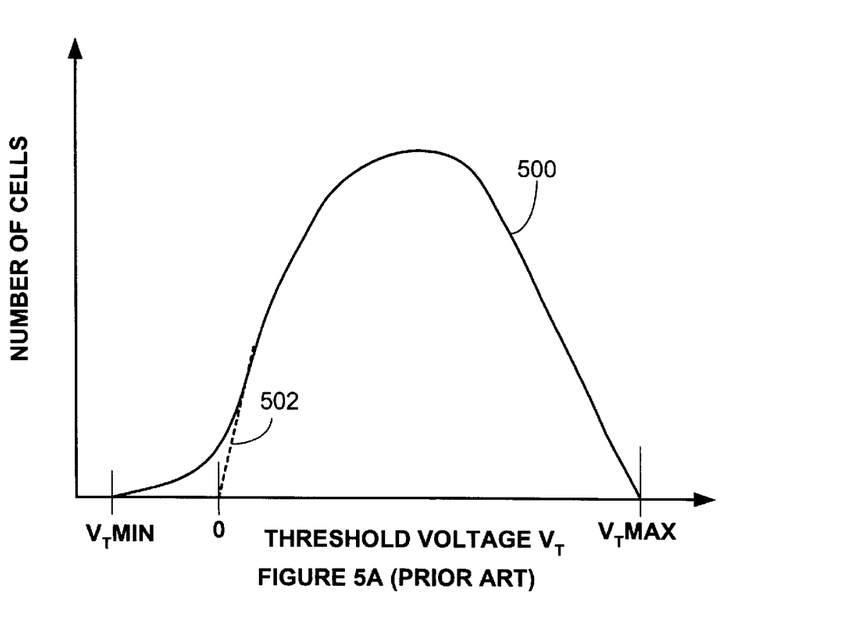
FIG. 5A is a graph illustrating a threshold voltage distribution in a flash EEPROM device after an erase operation.

FIG. 5A illustrates how the threshold voltages of the cells or bits in a flash EEPROM can differ following an erase operation as shown by curve 500 that represents the number of cells having particular values of threshold voltage $V_T$. It will be seen that the least erased cells will have relatively high threshold voltages in the region of $V_T$MAX, whereas the most overerased cells will have low threshold voltages in the region of $V_T$MIN that can be zero or negative. The characteristic curve illustrated in FIG. 5 is known as the threshold voltage distribution. The dashed portion of the curve 502 show the threshold voltages of the cells in a flash EEPROM after the overerase correction operation. It is noted that correcting the $V_T$ of the most overerased cells has changed the threshold voltage distribution. However, the threshold voltage distribution curve 502 indicates that there is a number of cells that still have a very low threshold voltage.

Because the background leakage current of a cell varies as a function of threshold voltage, the lower (more negative) the threshold voltage the higher the leakage current. Because there may be as many as 512 cells connected to a bitline, the background leakage current may still be sufficient to exceed the cell read current. It is therefore desirable to prevent cells from not only being over-erased but to reduce the threshold voltage distribution to as low a range as possible, with ideally all cells having the same high threshold voltage after erase on the order of 2 volts.

Therefore, what is needed is a method to tighten the threshold voltage distribution to as low a range as possible by increasing the threshold voltage of the cells with the lowest threshold voltage without affecting the threshold voltage of the cells with the highest threshold voltage.

SUMMARY OF THE INVENTION

According to the present invention, the foregoing and other objects and advantages are obtained by a memory device and a method of soft programming each memory cell in the memory device that tightens the threshold voltage distribution curve to have a maximum width of less than 2 volts. The soft programming voltages include a ramped voltage of less than 3 volts applied to the control gates of the memory cells being soft programmed, a voltage of less than 5 volts applied to the drains of the memory cells being soft programmed and a voltage of less than 0 volts applied to the substrates of the memory cells being soft programmed.

In accordance with one aspect of the invention, the threshold voltage distribution curve is tightened by applying soft programming voltages that are selected to utilize the hot-carrier mechanism to increase the threshold voltage of memory cells that have a low threshold voltage.

In accordance with another aspect of the invention, the initial voltage of the ramped control gate voltage is less than the threshold voltage of a least erased cell in the memory device.

In accordance with another aspect of the invention, the soft programming voltages are applied for a time period less than 10 microseconds.

In accordance with another aspect of the invention, the soft programming is applied to the memory device after the memory device has been erase verified and after the memory device has been overerase verified.

The described method thus provides a memory device and a method of tightening the threshold voltage distribution to have a maximum width of less than 2 volts.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1A:
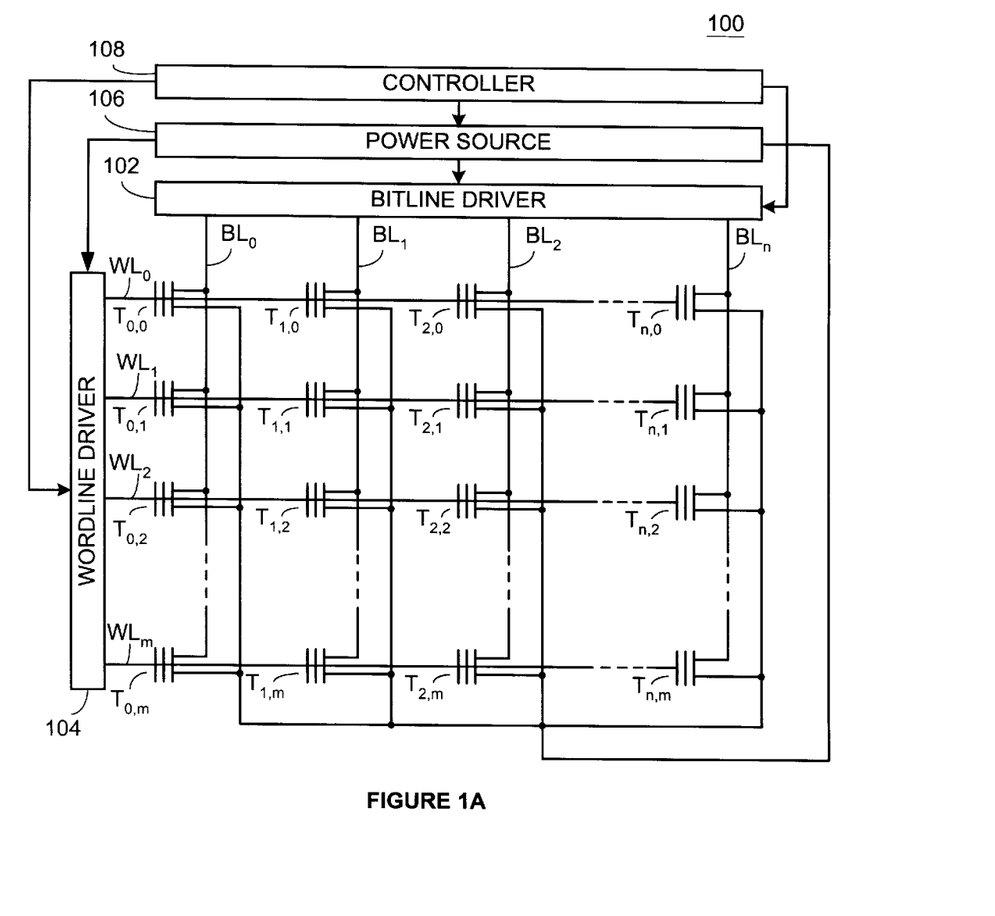
FIG. 1A is a simplified electrical schematic diagram of a flash EEPROM.

FIG. 1A illustrates a basic configuration of a NOR type flash Electrically Erasable Programmable Read-Only Memory (EEPROM) device 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$. and the wordlines are designated as $WL_0$ to $WL_m$. Appropriate voltages are applied to the bitlines by a bitline driver 102, whereas appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
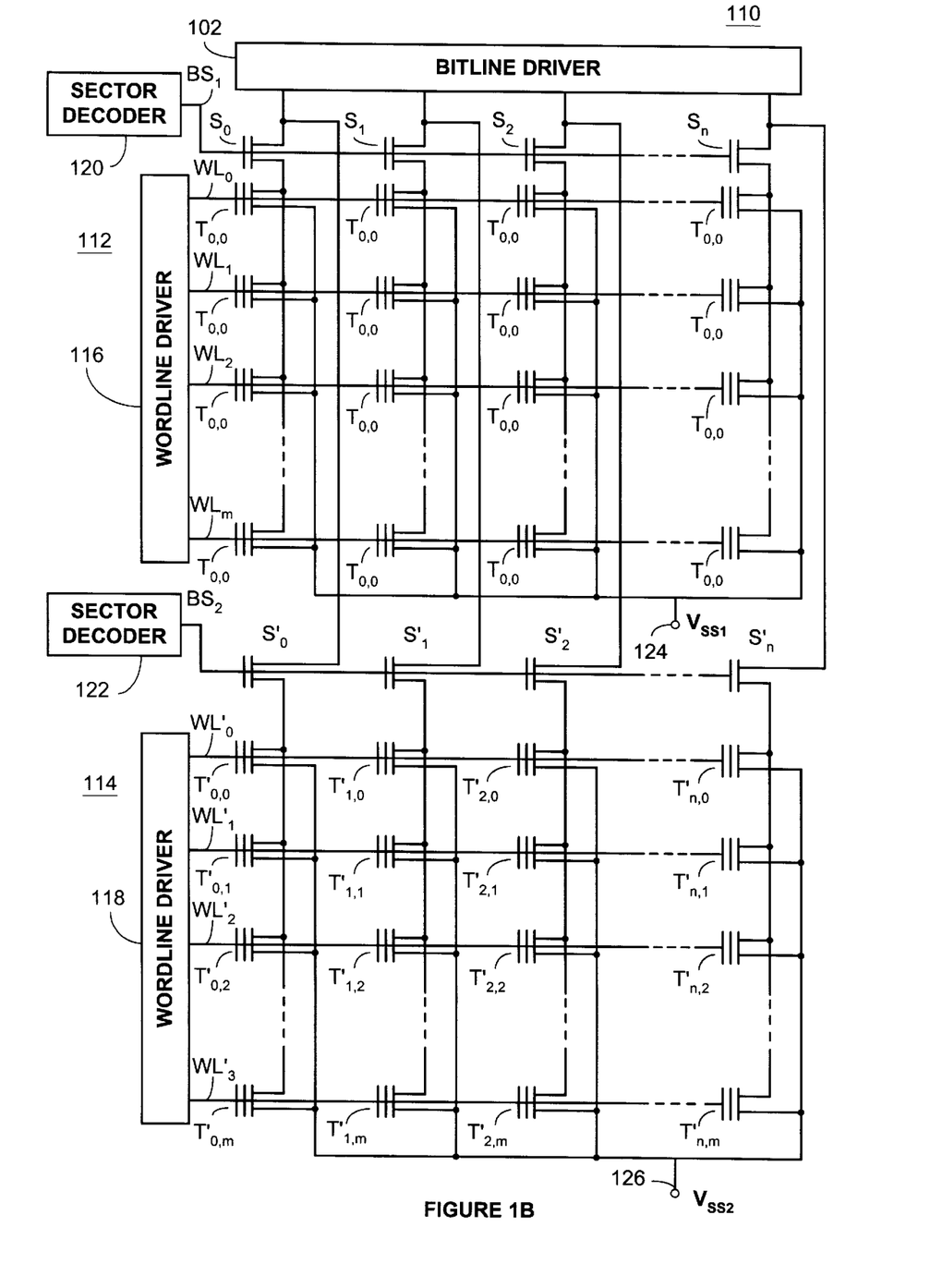
FIG. 1B is similar to FIG. 1A but illustrates a flash EEPROM having cells arranged in two pages or banks.

FIG. 1B illustrates another flash EEPROM memory 110 that is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select or pass transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122. The sources of the cells in bank 112 are connected to a common source supply voltage $V_{ss1}$ 124 and the sources of the cells in the bank 114 are connected to a common source supply voltage $V_{ss2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently or simultaneously.

Figure 2:
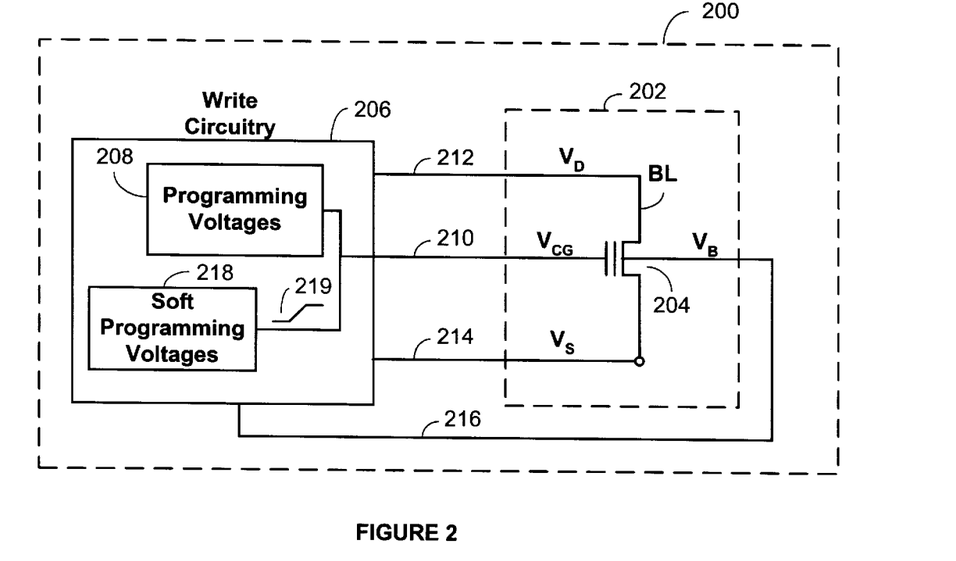
FIG. 2 illustrates a flash memory device showing write circuitry that applies programming and soft programming voltages to memory cells being programmed or being soft programmed.

FIG. 2 illustrates a flash memory device 200. The flash memory device 200 includes an array 202 of flash memory cells, which for purposes of illustration, shows a single flash memory cell 204. The flash memory device 200 includes write circuitry 206 that performs programming operations on the array 202 of flash memory cells, including the flash memory cell 204. Each programming operation on the flash memory cell 204 is referred to as a programming cycle.

The write circuitry 206 includes programming circuitry 208 that programs the flash memory cell 204 by generating a voltage that is applied to the control gate during the programming cycle via signal path 210, a voltage $V_D$ that is applied to the common drain via signal path 212, a voltage $V_S$ that is applied to the common source via signal path 214, and a voltage $V_B$ that is applied to the common well via signal path 216. It should be appreciated that the signal path 210 is a wordline.

The write circuitry 206 also includes soft programming circuitry 218 that soft programs the flash memory cell 204 and all of the flash memory cells on the wordline that includes the flash memory cell 204. The soft programming circuitry 218 generates a ramped voltage, as indicated at 219, that is applied to the control gate during the soft programming cycle via signal path 210, a voltage $V_D$ that is applied to the common drain via signal path 212, a voltage $V_S$ that is applied to the common source via signal path 214, and a voltage $V_B$ that is applied to the common well via signal path 216.

Figure 3:
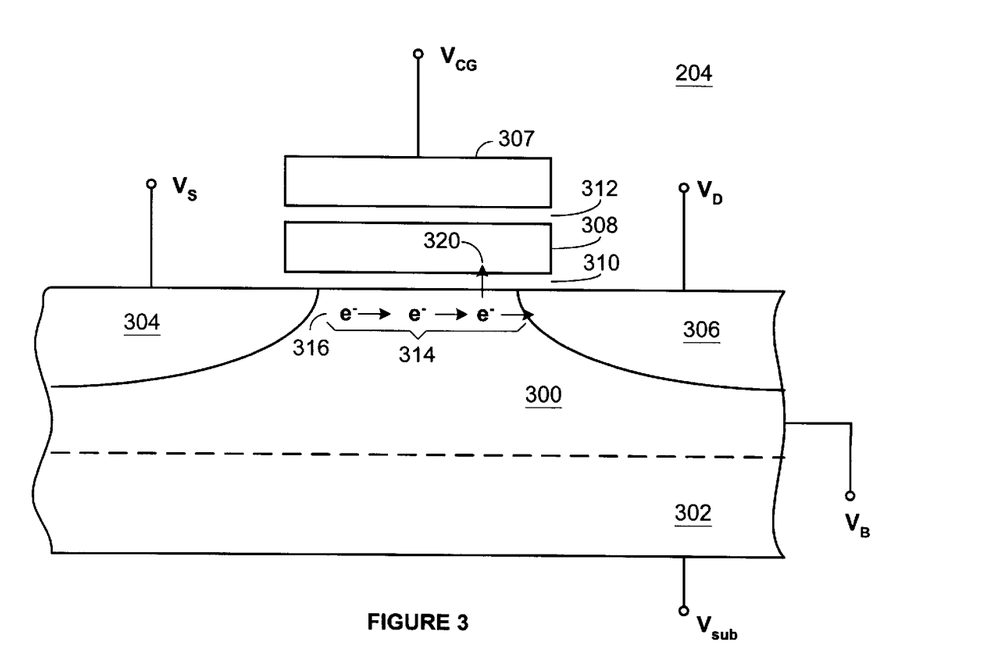
FIG. 3 illustrates the elements of a flash memory cell in a programming configuration.

FIG. 3 illustrates the elements of the flash memory cell 204 indicated in FIG. 2. The flash memory cell 204 is formed in on a silicon substrate 300. The silicon substrate may be a well formed in a first substrate material 302. The flash memory cell 204 includes a pair of doped regions 304 and 306 formed in either the silicon substrate or well 300. The doped region 304 functions as a source and the doped region 306 functions as a drain during programming cycles of the flash memory cell 204.

The flash memory cell 204 includes a stacked gate structure that includes a control gate 307 and a floating gate 308. In one embodiment, the control gate 307 and the floating gate 308 are each formed from doped polysilicon. The floating gate 308 is separated from an upper surface of the substrate 300 by an oxide layer 310. The oxide layer 310 is also referred to as a tunnel oxide. The control gate 307 is separated from the floating gate 308 by an oxide layer 312.

The programming circuitry 208 of the write circuitry 206 (FIG. 2) programs the flash memory cell 204 to a predetermined threshold voltage $V_T$ by applying a relatively constant drain voltage $V_D$ to the drain 306 while applying a gate voltage $V_{CG}$ to the control gate 307. During programming cycles, a voltage $V_S$ is maintained on the source 304. In addition, either the region 300 is maintained at a low voltage level during programming cycles. It should be appreciated that as explained above the region 300 may be a well region or a substrate region depending upon the embodiment. As will be discussed below, the voltage differential between the drains and the sources of cells not being programmed causes background leakage current that causes a high programming current to flow when multiple memory cells are being programmed.

As will also be discussed below, the soft programming circuitry 218 of the write circuitry 206 soft programs flash memory cells on a wordline by applying a ramped voltage pulse to the wordline, a voltage to the drains of the memory cells being soft programmed and a voltage to the sources of the memory cells being soft programmed.

The voltage differential VDS between the drain 306 and the source 304 causes electron flow through the channel region 314 of the flash memory cell 204. The electrons are represented by e⁻, at 316 in the channel region 314. Hot carrier injection occurs as high-energy electrons migrate through the oxide region 310 onto the floating gate 308. The path of a high-energy electron that migrates onto the floating gate 308 is represented by arrow 320.

Figure 5B:
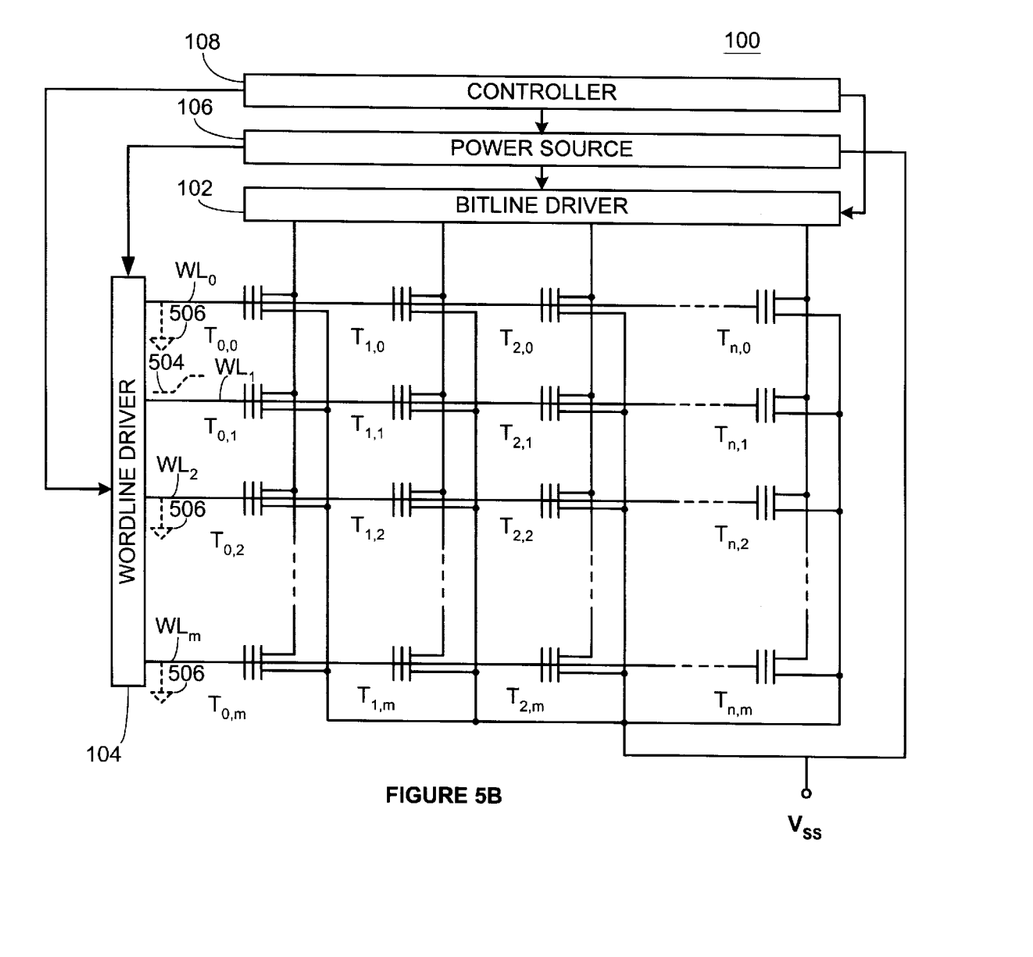
FIG. 5B is the simplified electrical schematic diagram of a flash EEPROM shown in FIG. 1A with representative voltages applied to the rows (wordlines) and columns (bitlines) of a matrix of memory cells during a soft programming operation.

FIG. 5B illustrates the method of soft programming in accordance with the present invention. FIG. 5B is the device 100 shown in FIG. 1A. The soft programming is accomplished at least a wordline at a time. It should be appreciated that FIG. 1A shows a single sector and that in accordance with the present invention multiple word lines can be soft programmed. A word line in more than one sector can be soft programmed because the method of the present invention is a low power method of soft programming. In FIG. 5B, wordline $WL_1$ is being programmed as indicated by the ramped voltage 504 being applied to the wordline by the wordline driver 104 and thus to all the control gates on the wordline. The wordlines, $WL_0$, $WL_2$ through $WL_m$, that are not being soft programmed are grounded as indicated at 506. The memory cells that are to be soft programmed are further selected by the bitline driver 102 applying a soft programming voltage of less than 5 volts to selected bitlines. For example, the bitlines $BL_0$ through $BL_n$ could be selected or any subset of the bitlines. In order to minimize leakage current during the soft programming, a substrate bias voltage of less than 0 volts is applied to the substrates (see FIG. 10 and associated discussion).

Figure 6:
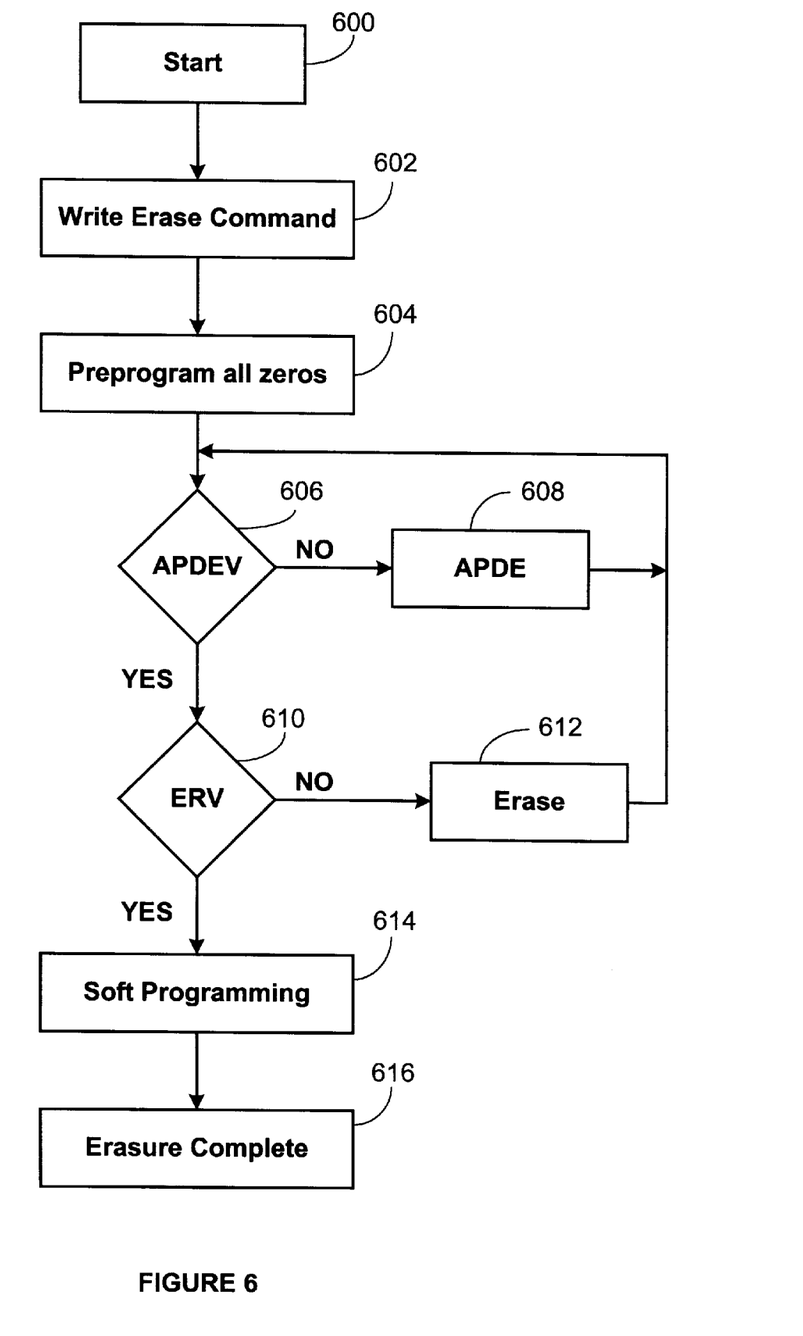
FIG. 6 is a flow diagram showing the method of soft programming in accordance with the present invention.

FIG. 6 is a flow diagram of the erase operation that is conducted on a Flash Memory device in accordance with the present invention. The erase operation starts as indicated at 600 with the generation of a Write Erase Command at 602. As is known in the flash memory art, the flash memory device is preprogrammed with all zeros as indicated at 604. The purpose of the preprogramming is to bring all cells to the same state in an effort to prevent overerasure of some of the cells. It is determined at 606 if the Automatic Programming Disturb Erase (APDE) operation is complete. If the APDE operation is not complete, the APDE program is run at 608. It is again determined at 606 if the APDE operation is complete. This cycle repeats until it is indicated at 606 that the APDE operation is complete. When it determined at 606 that the APDE operation is complete, it is determined at 610 if the erase operation (ERV) is complete. If it is determined at 610 that the erase operation is not complete, an erase operation is conducted as indicated at 612. After the erase operation at 612, it is determined at 606 if the APDE operation is complete, if not, the APDE operation is repeated at 608. This cycle repeats until the flash memory is completely erased and the overerase (APDE) operation has been completed. When it is indicated at 610 that the erase/overerase operation is complete, the soft programming operation in accordance with the present invention is conducted as indicated at 614. After the soft programming operation is complete at 614, the erasure is complete as indicated at 616.

Because of the continued scaling of flash memories for low voltages power applications has placed new demands on technology and the design of flash memories to achieve narrow erase threshold voltage $V_T$ distributions, the inventors have discovered a method to achieve a tight threshold voltage $V_T$ distribution for low voltage/low power FLASH memory devices. The method utilizes hot-carrier injection under low gate, drain, and substrate voltages to soft program overerased cells and compact (narrow) the $V_T$ distribution after erase. The soft programming as shown in FIG. 6 is implemented after the normal erase/APDE algorithm and can be implemented on a multibit byte or word at a time. In a typical erase operation, this configuration would add less than 200 msec per sector to the existing erase algorithm while narrowing the erase $V_T$ distribution to a width of less than 2 volts.

Figure 7:
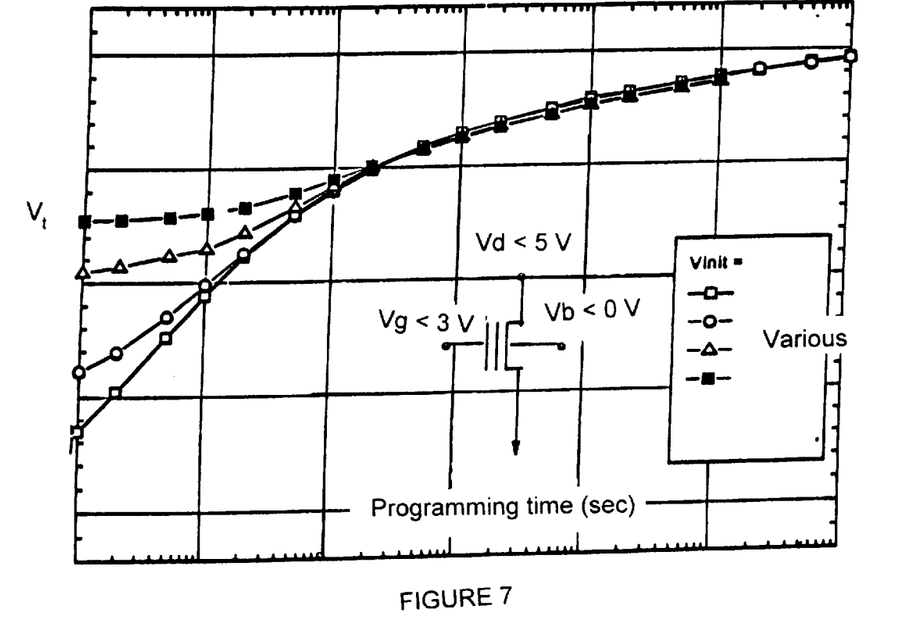
FIG. 7 shows the $V_T$ versus soft programming time for cells with different initial erase $V_T$ in a soft programming operation with substrate bias.

Soft programming uses the hot-carrier injection mechanism under low gate, drain, and substrate voltages. FIG. 7 illustrates the threshold voltage characteristic versus the soft programming time for a single cell with various initial erase voltage thresholds $V_T$. The figure demonstrates that under soft programming conditions of a ramped voltage $V_{GS}$ of less than 3 volts applied to the control gates, a voltage $V_{DS}$ of less than 5 volts applied to the drains, and a voltage $V_{sub}(V_b)$ of less than 0 volts applied to the substrate, a cell with a low initial $V_T$ would require a soft programming pulse of less than 10 μsec for the $V_T$ to reach a voltage greater than 0 volts. It is noted that the threshold voltage of cells that do not contribute to the leakage current is not changed during the application of the soft programming. The inventors have discovered that for a typical $V_T$ distribution after normal erase/APDE operations, the most erased cells will be soft programmed to a higher $V_T$ while cells from the main distribution will not be disturbed. The result is that the erase $V_T$ distribution will be narrowed and a width of less than 2 volts can be achieved.

Figure 8:
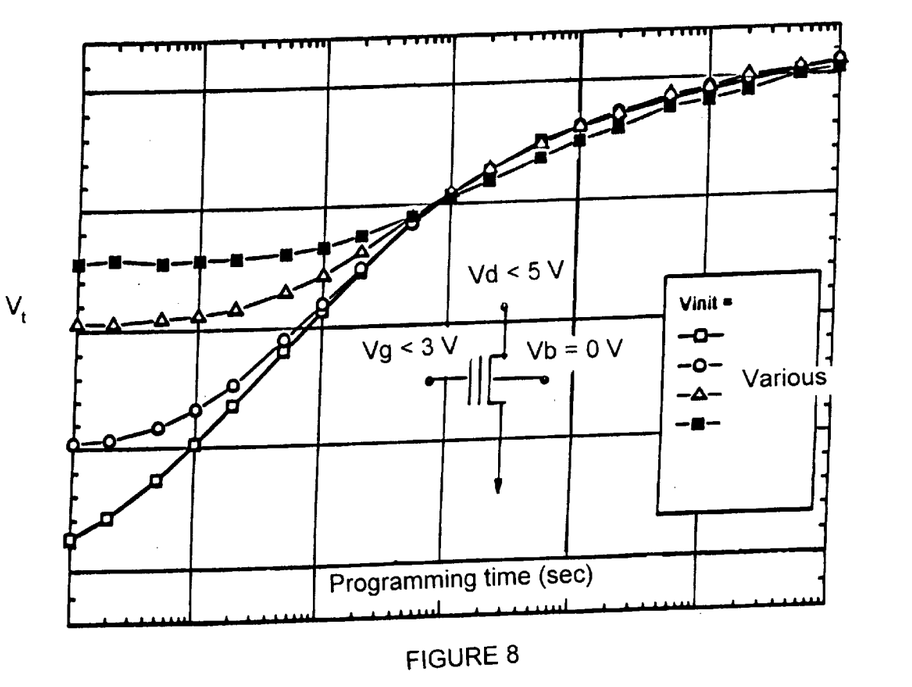
FIG. 8 shows the $V_T$ versus soft programming time for cells with different initial erase $V_T$ in a soft programming operation with no substrate bias.

The inventors have discovered that the use of a substrate bias improves both the hot-carrier injection efficiency of the cell under low gate and drain voltages, and also reduces the current required for soft programming. FIG. 8 shows $V_T$ versus soft programming under the same $V_{GS}$ and $V_{DS}$ as FIG. 7 but with $V_{sub}$=0 volts. Comparison of the two figures clearly demonstrates enhanced hot-carrier injection with substrate bias. It is noted that the use of a substrate bias reduces the soft programming current significantly, which benefits low power applications.

Based on the characterization of the particular flash memory cell being utilized, the time required for soft programming is less than <10 μsec/cell and requires a current in the range of <100 μA/cell using hot-carrier injection conditions of a ramped voltage $V_{GS}$ less than 3 volts applied to the control gates of the cells being soft programmed, a voltage $V_{DS}$ less than 5 volts applied to the drains of the cells being soft programmed, and a voltage $V_{sub}$<0 volts applied to the substrate. In this case, implementing soft programming with these condition on a multibit byte/word at a time would require <200 msec in addition to the typical 0.5 to 1.0 second erase time per sector. It is to be appreciated that these times and voltages are only examples of times and voltages that can be utilized and are given for illustrative purposes only and that other time ranges and voltage ranges could be utilized without departing from the scope of the invention.

Figure 9:
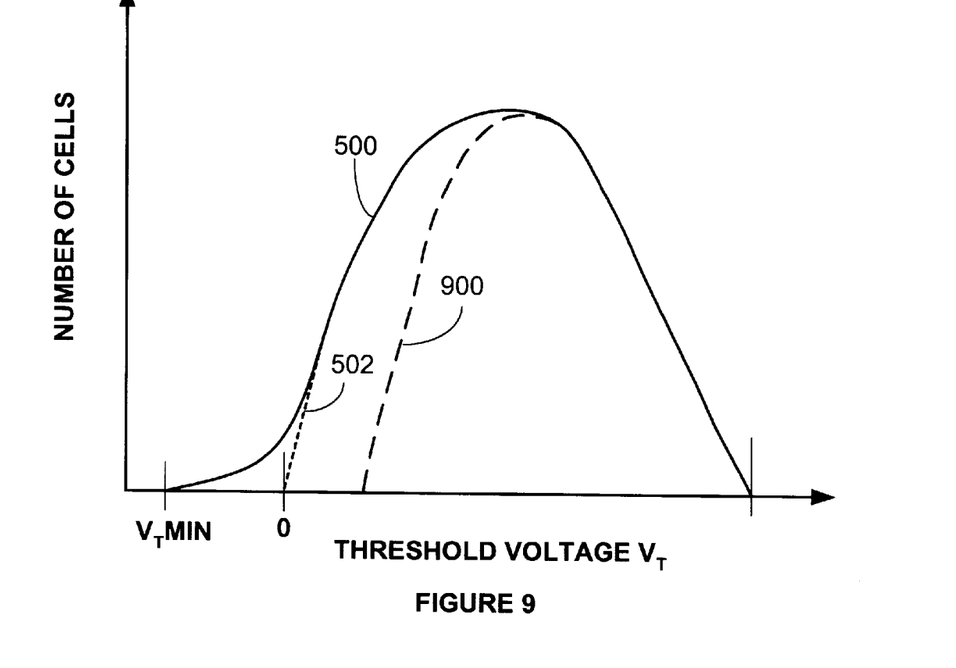
FIG. 9 illustrates the voltage threshold distribution after the application of the soft programming operation in accordance with the present invention.

FIG. 9 illustrates the narrowing of the threshold voltage curve $V_T$ versus number of cells. The solid curve 500 represents the threshold voltage distribution of cells after an erase operation, the dashed portion 502 indicates how overerase correction corrects the most overerased cells and is typically successful in increasing the threshold voltage of the most overerased cells above zero. The dashed line 900 indicates the voltage distribution of memory cells after the soft programming operation in accordance with the present invention.

Figure 10:
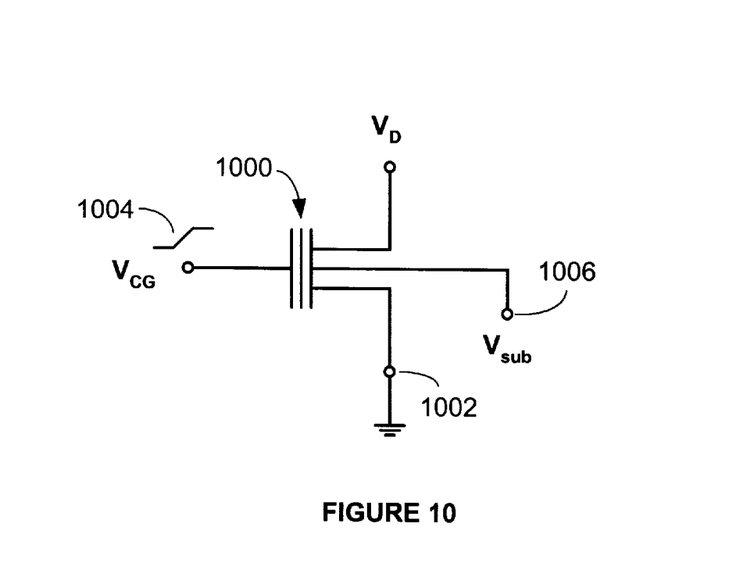
FIG. 10 is an electrical schematic diagram illustrating voltages applied to a memory cell during soft programming in accordance with the present invention.

FIG. 10 illustrates how the voltages are applied to a memory cell 1000 during a soft programming operation. The source is grounded as indicated at 1002, a ramped voltage is applied to the control gate, as indicated at 1004, and a bias voltage is applied to the substrate, as indicated at 1006. In an arrangement in which NMOS transistor cells, for example, are formed in P-type wells in a semiconductor substrate, a negative voltage can be applied to the P-wells. The source is grounded and a negative voltage applied to the substrate or P-well. This provides a higher horizontal electrical field for more effective soft programming.

In summary, the present invention overcomes the limitations of the prior art and tightens the threshold voltage distribution in a flash EEPROM after erase by increasing the threshold voltages of overerased cells while not affecting the threshold voltages of the least erased cells. In addition leakage current in the cells is substantially eliminated, thereby reducing the power requirements and resulting in a further tightening of the threshold voltage distribution. Furthermore the power required for soft programming is reduced thereby allowing more cells to be soft programmed simultaneously.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method to tighten the threshold voltage distribution curve in a memory device composed of multiple memory cells each having a source, drain, floating gate and control gate, wherein the memory cells are organized in rows and columns with the rows being wordlines and the columns being bitlines, the method comprising:

applying soft programming voltages to the drains, sources and control gates of selected memory cells, wherein the soft programming voltages are as follows:

a voltage less than 5 volts applied to the drains of the selected memory cells;

a voltage less than 0 volts applied to the substrate of the selected memory cells; and a ramped voltage less than 3 volts applied to the control gates of the selected memory cells.

2. The method of claim 1 wherein the soft programming voltages are selected to utilize a hot-carrier injection mechanism.

3. The method of claim 2 wherein the initial voltage of the ramped control gate voltage is less than the threshold voltage of a least erased cell.

4. The method of claim 3 wherein the soft programming voltages are applied to the memory cells being soft programmed for a time period in the range of less than 10 $\mu$s.

5. The method of claim 4 wherein the soft programming voltages applied to the cells being soft programmed reduces a maximum width of the threshold voltage distribution to less than 2 volts.

6. The method of claim 1 further comprising verifying that all memory cells in the memory device have been erased before applying the soft programming voltages.

7. The method of claim 6 further comprising verifying that all memory cells in the memory device have been corrected for overerasure before applying the soft programming voltages.

8. A flash Electrically-Erasable Programmable Read-Only Memory (EEPROM), comprising:

a plurality of memory cells each having a source, drain, floating gate, control gate and substrate;

a power source for applying voltages to the drains, sources, substrates and control gates of selected memory cells; and a controller for controlling the power source to apply soft programming voltages to the drains, sources, substrates and control gates of the selected memory cells, wherein the power source applies a soft programming voltage of less than 5 volts to the drains of the selected memory cells, a soft programming voltage of less than 0 volts to the substrates of the selected memory cells, and a ramped voltage less than 3 volts to the control gates of the selected memory cells.

9. The memory of claim 8, in which the controller controls the power source to apply soft programming voltages to utilize a hot-carrier injection mechanism.

10. The memory of claim 9, in which the controller controls the power source to apply a ramped voltage to the control gates having an initial voltage of less than the threshold voltage of a least erased cell.

11. The memory of claim 10, in which the controller controls the power source to apply the soft programming voltages for a time period in the range of less than 10 $\mu$s.

* * * * *